(12) United States Patent
Chen et al.

(10) Patent No.: US 11,888,009 B2
(45) Date of Patent: Jan. 30, 2024

(54) SENSING APPARATUS HAVING LIGHT-TRANSMITTING ADHESIVE LAYER

(71) Applicant: Au Optronics Corporation, Hsinchu (TW)

(72) Inventors: Yan-Liang Chen, Hsinchu (TW); Mei-Lien Huang, Hsinchu (TW); Chin-Hsing Li, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 235 days.

(21) Appl. No.: 17/351,254

(22) Filed: Jun. 18, 2021

(65) Prior Publication Data

US 2022/0052094 A1 Feb. 17, 2022

Related U.S. Application Data

(60) Provisional application No. 63/066,391, filed on Aug. 17, 2020.

(30) Foreign Application Priority Data

Mar. 22, 2021 (TW) .................................. 110110147

(51) Int. Cl.
*H01L 27/146* (2006.01)
*G02B 3/00* (2006.01)
*G06V 40/13* (2022.01)

(52) U.S. Cl.
CPC ...... *H01L 27/14627* (2013.01); *G02B 3/0006* (2013.01); *H01L 27/14623* (2013.01);
(Continued)

(58) Field of Classification Search
CPC ......... H01L 27/14623; H01L 27/14625; H01L 27/14627; H01L 27/14678;
(Continued)

(56) References Cited

U.S. PATENT DOCUMENTS 7,259,915 B2 8/2007 Kwon et al.
8,077,230 B2 12/2011 Liu
(Continued)

FOREIGN PATENT DOCUMENTS

CN 1704773 12/2005
CN 111261652 6/2020

*Primary Examiner* — Nelson Garces
(74) *Attorney, Agent, or Firm* — JCIPRNET

(57) ABSTRACT

A sensing apparatus including a sensing device, a light-transmitting protective layer, a light-shielding layer, a light-transmitting adhesive layer and a light guide device is provided. The light-transmitting protective layer is disposed on the sensing device. The light-shielding layer is disposed on the light-transmitting protective layer. The light shielding layer has a pinhole corresponding to the sensing device. The light-transmitting adhesive layer is disposed on the light-transmitting protective layer and at least in the pinhole. The light guide device is disposed on the light-transmitting adhesive layer and corresponds to the pinhole. There is a gap between the light guide device and the light shielding layer; and/or the refractive index of the light-transmitting adhesive layer is greater than the refractive index of the light guide device.

17 Claims, 5 Drawing Sheets

(52) U.S. Cl.
CPC .. *H01L 27/14678* (2013.01); *H01L 27/14685* (2013.01); *G06V 40/1318* (2022.01)

(58) Field of Classification Search
CPC ... H01L 27/14621; G02B 1/14; G02B 3/0037; G06V 40/1318
See application file for complete search history.

(56) References Cited

U.S. PATENT DOCUMENTS

| | | | |
|---|---|---|---|
| 2005/0264863 | A1 | 12/2005 | Kwon et al. |
| 2009/0014823 | A1* | 1/2009 | Kokusenya ....... H01L 27/14843 257/E31.127 |
| 2009/0127441 | A1 | 5/2009 | Hwang, II |
| 2015/0185380 | A1* | 7/2015 | Miyashita ......... H01L 27/14627 348/739 |
| 2018/0301494 | A1* | 10/2018 | Park .................. H01L 27/14623 |
| 2020/0119072 | A1* | 4/2020 | Lim .................... H01L 27/1462 |
| 2022/0293657 | A1* | 9/2022 | Chou ................. G06V 40/1324 |
| 2023/0013285 | A1* | 1/2023 | Yorikado .......... H01L 27/14689 |

* cited by examiner

SENSING APPARATUS HAVING LIGHT-TRANSMITTING ADHESIVE LAYER

CROSS-REFERENCE TO RELATED APPLICATION

This application claims the priority benefit of U.S. provisional application Ser. No. 63/066,391, filed on Aug. 17, 2020 and Taiwanese application serial no. 110110147, filed on Mar. 22, 2021. The entirety of each of the above-mentioned patent applications is hereby incorporated by reference herein and made a part of this specification.

BACKGROUND

Technical Field

The disclosure relates to a sensing apparatus, and more particularly to a sensing apparatus having a light-transmitting adhesive layer.

Description of Related Art

In a conventional sensing apparatus, a light guide device is often used to adjust the optical path. However, during the manufacturing process or application of the sensing apparatus (for example, during the manufacturing process of integrating with other elements or devices), the light guide device may be peeled. Therefore, how to improve the yield rate of the sensing apparatus and the reliability of the product has become an urgent issue to be solved at present.

SUMMARY

The disclosure provides a sensing apparatus, which can have a smaller thickness, an improved yield rate, and/or an improved optical signal quality.

A sensing apparatus of the disclosure includes a sensing device, a first light-transmitting protective layer, a light-shielding layer, a light-transmitting adhesive layer and a light guide device. The first light-transmitting protective layer is disposed on the sensing device. The light-shielding layer is disposed on the first light-transmitting protective layer. The light-shielding layer has a pinhole corresponding to the sensing device. The light-transmitting adhesive layer is disposed on the first light-transmitting protective layer and at least located in the pinhole. The light guide device is disposed on the light-transmitting adhesive layer and corresponds to the pinhole. There is a gap between the light guide device and the light shielding layer.

A sensing apparatus of the disclosure includes a sensing device, a first light-transmitting protective layer, a light-shielding layer, a light-transmitting adhesive layer and a light guide device. The first light-transmitting protective layer is disposed on the sensing device. The light-shielding layer is disposed on the first light-transmitting protective layer. The light-shielding layer has a pinhole corresponding to the sensing device. The light-transmitting adhesive layer is disposed on the first light-transmitting protective layer and at least located in the pinhole. The light guide device is disposed on the light-transmitting adhesive layer and corresponds to the pinhole. The refractive index of the light-transmitting adhesive layer is greater than the refractive index of the light guide device.

Based on the above, with the light-transmitting adhesive layer of the sensing apparatus, the sensing apparatus can have a smaller thickness, an improved yield rate, and/or an improved optical signal quality.

DESCRIPTION OF THE EMBODIMENTS

Figure 1A:
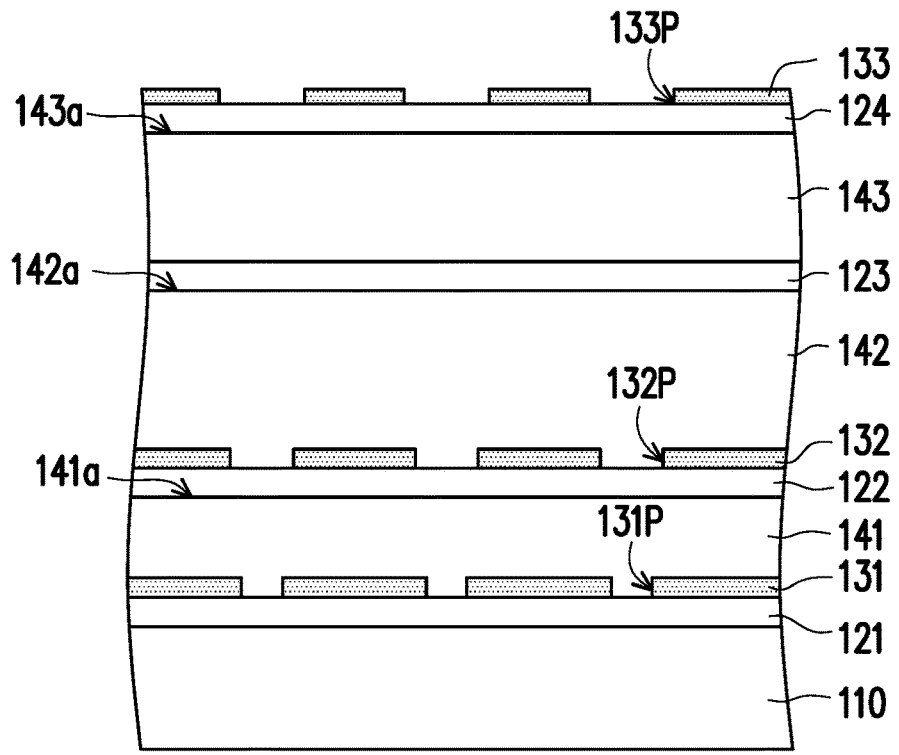
FIG. 1A to FIG. 1E are schematic partial cross-sectional views of a part of a manufacturing method of a sensing apparatus according to a first embodiment of the disclosure.

In the drawings, the thickness of layers, films, panels, regions, etc., are exaggerated for clarity. Throughout the specification, the same reference numerals denote the same elements. It should be understood that when an element such as a layer, film, region, or substrate is referred to as being "on" or "connected" to another element, it can be directly on or connected to the other element, or an intermediate elements may also be present. In contrast, when an element is referred to as being "directly on" or "directly connected to" another element, there are no intermediate elements. As used herein, "connected" can refer to physical and/or electrical connection. Furthermore, "electrical connection" or "couple to" can mean that there are other elements between two elements.

It should be understood that although the terms "first", "second", etc. may be used herein to describe various elements, components, regions, layers, and/or portions, these elements, components, regions, and/or portions should not be limited by these terms. These terms are only used to distinguish one element, component, region, layer or portion from another element, component, region, layer or portion. Therefore, the "first element", "component", "region", "layer" or "portion" discussed below may be referred to as a second element, component, region, layer or portion without departing from the teachings of the disclosure.

The terms used herein are only for the purpose of describing specific embodiments, and are not restrictive. As used herein, unless clearly indicated otherwise, the singular forms "a/an", "one" and "the" are intended to include plural forms, including "at least one." "Or" means "and/or". As used herein, the term "and/or" includes any and all combinations of one or more of the related listed items. It should also be understood that when used in this specification, the terms "including" and/or "comprises" refer to the presence of the features, regions, wholes, steps, operations, elements, and/or components, but do not exclude presence or addition of one or more other features, regions as a whole, steps, operations, elements, components, and/or combinations thereof.

In addition, relative terms such as "lower" or "bottom" and "upper" or "top" can be used herein to describe the relationship between one element and another element, as shown in the figure. It should be understood that relative terms are intended to include different orientations of the device in addition to the orientation shown in the figures. For example, if the device in a figure is turned over, then elements described as being on the "lower" side of other elements will be positioned on the "upper" side of the other elements. Therefore, the exemplary term "lower" may include an orientation of "lower" and "upper", depending on the specific orientation of the figure. Similarly, if the device in a figure is turned over, then elements described as "below" or "under" other elements will be positioned "above" other elements. Thus, the exemplary terms "below" or "under" can include an orientation of above and below.

Unless otherwise defined, all terms (including technical and scientific terms) used herein have the same meaning as commonly comprehended by those of ordinary skill in the art to which the present disclosure belongs. It should be further understood that terms such as those defined in commonly used dictionaries should be interpreted as having meanings consistent with their meanings in the context of related technologies and the present disclosure, and should not be interpreted as an idealized or excessive formal meaning, unless explicitly defined as such in the disclosure.

The exemplary embodiments are described herein with reference to cross-sectional views that are schematic diagrams of idealized embodiments. Therefore, a change in the shape of the illustration as a result of, for example, manufacturing technology and/or tolerances can be expected. As such, the embodiments described herein should not be construed as being limited to the specific shape of the region as shown herein, but include, for example, shape variations caused by manufacturing. For instance, regions shown or described as flat may generally have rough and/or non-linear characteristics. In addition, the acute angles shown may be rounded. In light of the above, the regions shown in the figures are exemplary in nature, and their shapes are not intended to show the precise shape of the regions, and are not intended to limit the scope of the claims.

Figure 1B:
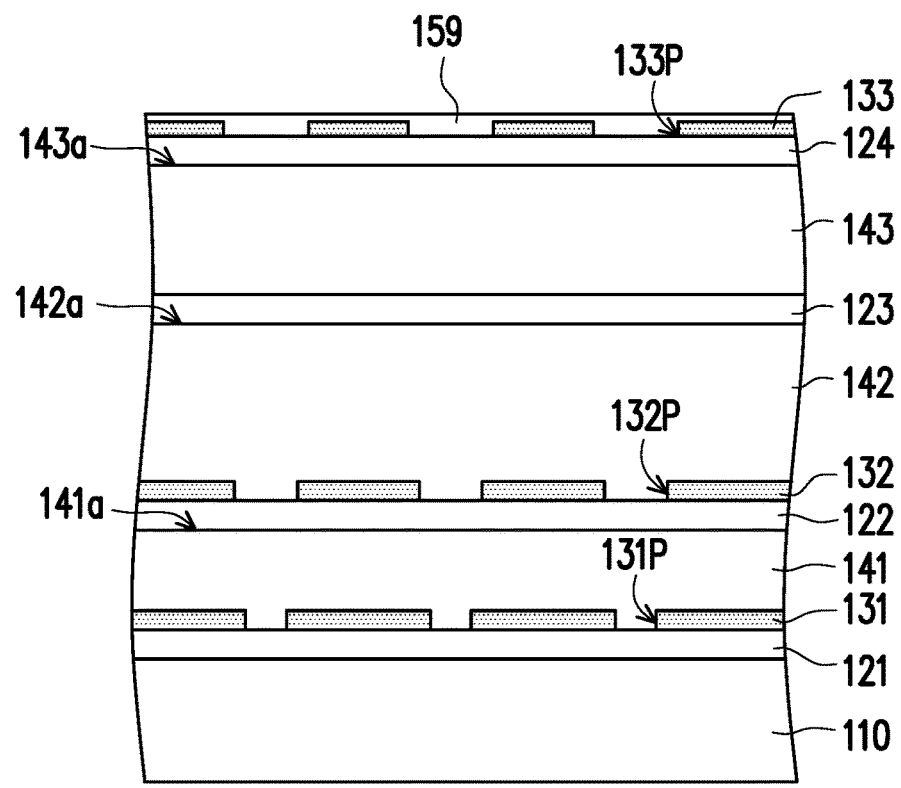
Figure 1C:
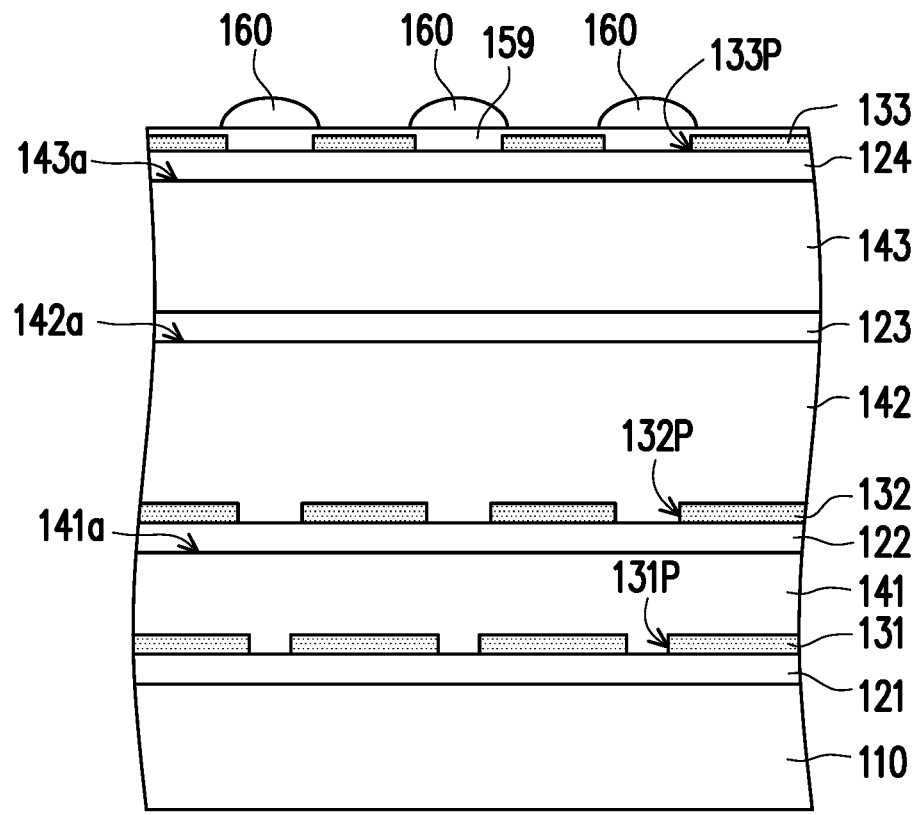
Figure 1D:
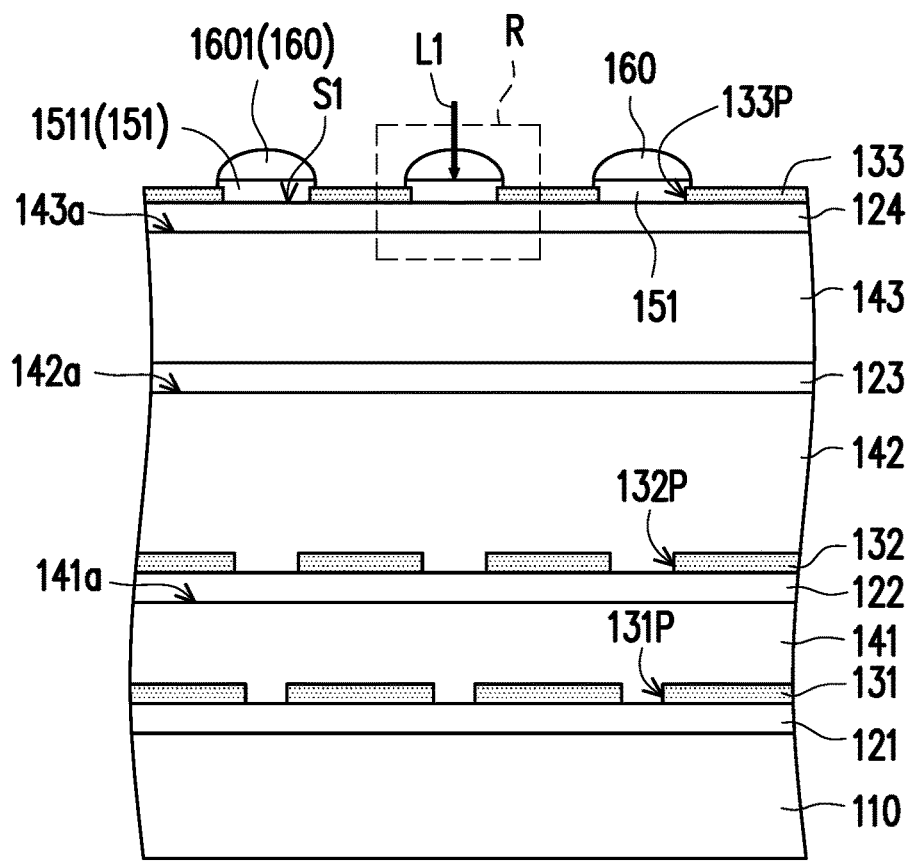
Figure 1E:
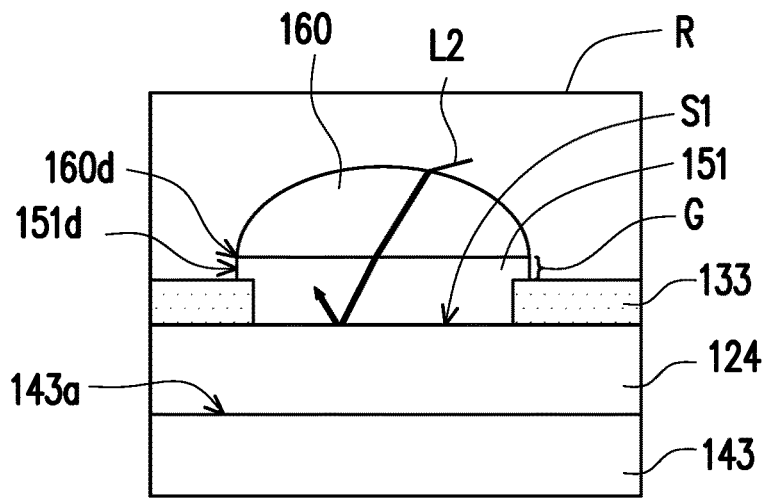

FIG. 1A to FIG. 1E are schematic partial cross-sectional views of a part of a manufacturing method of a sensing apparatus according to a first embodiment of the disclosure. FIG. 1E may be an enlarged view corresponding to the region R in FIG. 1D.

Please refer to FIG. 1A, a sensing device 110 is provided. In an embodiment, the sensing device 110 may be configured on a carrier (not shown) or formed on a substrate (not shown), but the disclosure is not limited thereto.

In an embodiment, the sensing device 110 may include a corresponding light-transmitting electrode (not shown), a bottom electrode (not shown), and a light-sensing layer (not shown) sandwiched between the light-transmitting electrode and the bottom electrode, but the disclosure is not limited thereto. In an embodiment, the light-sensing layer may include silicon-rich oxide (SRO) material, but the disclosure is not limited thereto. In addition, the disclosure provides no limitation to the number of sensor units in the sensing device 110.

Please refer to FIG. 1A further, common methods in general semiconductor manufacturing processes (such as: deposition/plating, lithography, etching, cleaning, coating, baking, etc., but not limited to) can be adopted to form a corresponding layer on the sensing device 110.

In this embodiment, the first light-transmitting protective layer 121, the first light-shielding layer 131, the first flat layer 141, the second light-transmitting protective layer 122, the second light-shielding layer 132, the second flat layer 142, the third light-transmitting protective layer 123, the third flat layer 143, the fourth light-transmitting protective layer 124, and/or the third light-shielding layer 133 may be formed on the sensing device 110. In an embodiment, another layer (such as an IR-cut layer, but not limited thereto) may be provided between the two layers mentioned above. The thickness of various layers can be adjusted according to design requirements, and is not limited in the disclosure.

In an embodiment, at least one or a part of the first light-transmitting protective layer 121, the second light-transmitting protective layer 122, the third light-transmitting protective layer 123, and/or the fourth light-transmitting protective layer 124 may be referred to as a back channel passivation layer (BP layer), but the disclosure is not limited thereto. In an embodiment, the material of the first light-transmitting protective layer 121, the second light-transmitting protective layer 122, the third light-transmitting protective layer 123 and/or the fourth light-transmitting protective layer 124 may include silicon oxide, silicon nitride, silicon oxynitride, a combination of the above, or a stack of the above, but the disclosure is not limited thereto.

In an embodiment, the surface of the first flat layer 141, the second flat layer 142, and/or the third flat layer 143 away from the sensing device 110 (such as: the first surface 141a of the first flat layer 141, the second surface 142a of the second flat layer 142 and/or the third surface 143a of the third flat layer 143) may be flat surfaces. In an embodiment, the material of the first flat layer 141, the second flat layer 142, and/or the third flat layer 143 may include inorganic materials (for example, silicon oxide, silicon nitride, silicon oxynitride, other suitable materials, a combination of the above or a stack of the above), organic materials (for example: polyester (PET), polyalkene, polyacryl, polycarbonate, polyalkylene oxide, polyphenylene, polyether, polyketone, polyalcohol, polyaldehyde, other suitable materials, a combination of the above or a stack of the above), a combination of the above or a stack of the above, but the disclosure is not limited thereto.

In an embodiment, at least one or a part of the first light-transmitting protective layer 121, the second light-transmitting protective layer 122, the third light-transmitting protective layer 123, the fourth light-transmitting protective layer 124, the first flat layer 141, the second flat layer 142 and/or the third flat layer 143 may be referred to as an optical collimation layer, but the disclosure is not limited thereto.

In an embodiment, the material of the first light-shielding layer 131, the second light-shielding layer 132 and/or the third light-shielding layer 133 may be metal (such as copper (Cu), aluminum (Al), molybdenum (Mo), titanium (Ti), argentum (Ag), niobium (Nb), but not limited thereto), alloys or co-gold compounds containing the above elements (such as molybdenum tantalum (MoTa), molybdenum niobium (MoNb), or molybdenum titanium (MoTi), but not limited thereto), the aforementioned metal oxides or metal oxynitrides (such as: molybdenum oxide ($MoO_x$), molybdenum tantalum oxide ($MoTaO_x$), molybdenum niobium oxide ($MoNbO_x$), molybdenum oxynitride ($MoO_xN_y$), molybdenum tantalum oxynitride ($MoTaO_xN_y$), molybdenum niobium oxynitride ($MoNbO_xN_y$), but not limited thereto), or a combination or stack of the above, but the disclosure is not limited thereto. In addition, x or y in the aforementioned chemical formula may be adopted as a way of expressing a numerical value in a general chemical formula, and it is not limited that x or y is a natural number or the same or fixed numerical value. Furthermore, in the aforementioned alloy or co-gold compound, there is no limit to the ratio of each metal element.

The first light-shielding layer 131 may have a first pinhole 131p. The first pinhole 131p of the first light-shielding layer 131 substantially corresponds to or overlaps the sensing device 110. The second light-shielding layer 132 may have a second pinhole 132p. The second pinhole 132p of the second light-shielding layer 132 substantially corresponds to or overlaps the first pinhole 131p of the first light-shielding layer 131. The hole diameter of the first pinhole 131p is substantially smaller than the hole diameter of the second pinhole 132p. The third light-shielding layer 133 may have a third pinhole 133p. The third pinhole 133p of the third light-shielding layer 133 substantially corresponds to or overlaps the second pinhole 132p of the second light-shielding layer 132. The hole diameter of the second pinhole 132p is substantially smaller than the hole diameter of the third pinhole 133p.

In this embodiment, one sensing device 110 may correspond to multiple first pinholes 131p, multiple second pinholes 132p, and multiple third pinholes 133p, but the disclosure is not limited thereto. In an embodiment, one sensing device (which may be similar to the sensing device 110) may correspond to one first pinhole 131p, one second pinhole 132p, and one third pinhole 133p.

Referring to FIG. 1A to FIG. 1B, a light-transmitting adhesive material layer 159 is formed on the third light-shielding layer 133. The first light-transmitting adhesive material layer 159 may further fill the third pinhole 133p of the third light-shielding layer 133, and may cover a part of the fourth light-transmitting protective layer 124 exposed by the third pinhole 133p.

In this embodiment, the light-transmitting adhesive material layer 159 may be an unpatterned layer.

In an embodiment, the light-transmitting adhesive material layer 159 may be comprehensively formed on the third light-shielding layer 133. It should be noted that the aforementioned "comprehensively formed" can be performed by covering the layer formed latter on the substrate and/or layer formed earlier by means of deposition, plating or other similar methods without the patterning step. Certainly, in a general semiconductor manufacturing process, the layer formed latter may further partially cover the edge of the substrate and/or the layer formed earlier. Alternatively, since the existing components of the deposition or plating machine (for example, the shadow frame used to reduce the side plating or the fixed parts used to fix the substrate) may be a part of the region that is left uncovered, all of the above situations can be involved in the condition of "comprehensively formed" defined in the disclosure.

In this embodiment, the light-transmitting adhesive material layer 159 (or; the layer formed therefrom, such as the light-transmitting adhesive layer 151 in the subsequent figures) has a refractive index greater than that of the fourth light-transmitting protective layer 124. For example, the refractive index of the light-transmitting adhesive material layer 159 (or; the layer formed therefrom, such as the light-transmitting adhesive layer 151 in the subsequent figures) may be about 1.85 to 2.05, and the refractive index of the fourth light-transmitting protective layer 124 may be about 1.60 to 1.80.

In an embodiment, the material of the light-transmitting adhesive material layer 159 may be similar to but different from the material of the third light-shielding layer 133. For example, the material of the light-transmitting adhesive material layer 159 may include a light-transmitting metal oxide, and the material of the third light-shielding layer 133 may include an opaque metal oxide and/or metal. In another example, in an etchant, the etching rate of the material of the light-transmitting adhesive material layer 159 is different from the etching rate of the material of the third light-shielding layer 133. The etchant can be selected according to the corresponding material, which is not limited in the disclosure.

In an embodiment, by making the material of the light-transmitting adhesive material layer 159 to be similar to the material of the third light-shielding layer 133, the bonding force between the light-transmitting adhesive material layer 159 and the third light-shielding layer 133 can be improved. For example, the possibility that the light-transmitting adhesive material layer 159 (or a layer formed therefrom, such as the light-transmitting adhesive layer 151 in the subsequent figures) is peeled off from the third light-shielding layer 133 can be reduced.

In an embodiment, the material of the light-transmitting adhesive material layer 159 may include light-transmitting metal oxides (such as zinc oxide (ZnO), indium-zinc oxide (IZO), or a combination of the foregoing, but not limited thereto) or contain the above metal oxides that are doped, but the disclosure is not limited thereto.

Referring to FIG. 1B to FIG. 1C, a light guide device 160 is configured or formed on the light-transmitting adhesive material layer 159. The light guide device 160 corresponds to the third pinhole 133p of the third light-shielding layer 133.

In this embodiment, the light guide device 160 is, for example, a lens (such as a micro lens), but the disclosure is not limited thereto.

In an embodiment, the light guide device 160 may be a pre-formed device and then disposed on the light-transmitting adhesive material layer 159.

In an embodiment, a light-transmitting material layer may be formed on the light-transmitting adhesive material layer 159, and then a corresponding light guide device 160 may be formed through a suitable method (such as embossing, but not limited thereto).

In an embodiment, the material of the light guide device 160 may include glass, quartz or polymer, but the disclosure is not limited thereto.

In this embodiment, the refractive index of the light-transmitting adhesive material layer 159 (or; the layer formed therefrom, such as the light-transmitting adhesive layer 151 in the subsequent figures) is greater than the refractive index of the light guide device 160. For example, the refractive index of the light guide device 160 may be about 1.40 to 1.70.

Referring to FIG. 1C to FIG. 1D and FIG. 1E, after the light guide device 160 is configured or formed, a part of the light-transmitting adhesive material layer 159 (marked in FIG. 1C) is removed to form the light-transmitting adhesive layer 151 (marked in FIG. 1D or FIG. 1E).

In this embodiment, the light guide device 160 can be used as an etching mask, and a part of the light-transmitting adhesive material layer 159 that is not covered by the light guide device 160 can be removed by etching. In this way, compared to the photolithography method, the above-mentioned method is simpler and has lower costs. For example, by adopting the above method, the use of a photomask can be omitted, and the light-transmitting adhesive material layer 159 (marked in FIG. 1C) can be patterned to form the light-transmitting adhesive layer 151 (marked in FIG. 1D or FIG. 1E).

In this embodiment, by adopting the above method, the projection area of the light guide device 160 on a projection surface (such as the first surface 141a, the second surface 142a, and/or the third surface 143a; or the surface in contact with the above surface) is substantially the same as the projection area of the corresponding light-transmitting adhesive layer 151 on the aforementioned projection surface. For example, the light-transmitting adhesive layer 1511 (a part of the light-transmitting adhesive layer 151) corresponds to the light guide device 1601 (one of the light guide devices 160), and the projection area of the light guide device 1601 on a projection surface is substantially the same as the projection area of the light-transmitting adhesive layer 1511 on the aforementioned projection surface.

In this embodiment, by adopting the above-mentioned method, the edge 160*d* of the light guide device 160 in contact with the light-transmitting adhesive layer 151 can be substantially aligned with the side 151*d* of the light-transmitting adhesive layer 151.

It should be noted that if wet etching or other similar isotropic etching methods are adopted, a minor side etching phenomenon may be caused to the side 151*d* of the light-transmitting adhesive layer 151. As a result, the projection area of the light guide device 160 on a projection surface may be slightly larger than the projection area of the corresponding light-transmitting adhesive layer 151 on the aforementioned projection surface; and/or, the side 151*d* of the light-transmitting adhesive layer 151 becomes slightly retracted than the edge 160*d* of the light guide device 160. However, the above-mentioned side etching phenomenon that may be caused by the etching method (not limited to the type of etching method) can still be covered by the foregoing description; and/or can still be an equal expansion of the aforementioned description "on the substrate". In addition, in the terms "substantially the same area", "substantially aligned edges" or similar terms, even if they are directly described in terms of "same area", "aligned edge" or similar terms, they should still be interpreted as an equal expansion of the term "on the substrate" used above.

In a possible embodiment, part of the light-transmitting adhesive material layer 159 may also be removed by anisotropic etching.

In this embodiment, the etching agent can be adaptively selected at least according to the material of the light guide device 160, the material of the light-transmitting adhesive layer 151, and the material of the third light-shielding layer 133, the disclosure provides no limitation thereto. For example, the etching rate of the etchant on the material of the light-transmitting adhesive layer 151 is greater than the etching rate of the etchant on the material of the light guide device 160 and the etching rate of the etchant on the material of the third light-shielding layer 133.

After the above-mentioned manufacturing process, the fabrication of the sensing apparatus 100 in this embodiment is substantially completed.

Referring to FIG. 1D and FIG. 1E, the sensing apparatus 100 includes a sensing device 110, a fourth light-transmitting protective layer 124, a third light-shielding layer 133, a light-transmitting adhesive layer 151, and a light guide device 160. The fourth light-transmitting protective layer 124 is located on the sensing device 110. The third light-shielding layer 133 is located on the fourth light-transmitting protective layer 124. The third light-shielding layer 133 has a third pinhole 133*p* corresponding to the sensing device 110. The light-transmitting adhesive layer 151 is located on the fourth light-transmitting protective layer 124 and at least in the third pinhole 133*p*. The light guide device 160 is disposed on the light-transmitting adhesive layer 151 and corresponds to the third pinhole 133*p*.

In this embodiment, there is a gap G between the light guide device 160 and the third light-shielding layer 133. In other words, the light guide device 160 substantially does not physically contact the third light-shielding layer 133. In this embodiment, there is at least a light-transmitting adhesive layer 151 between the light guide device 160 and the third light-shielding layer 133.

In this embodiment, the light-transmitting adhesive layer 151 may be further located on the third light-shielding layer 133. In other words, part of the third light-shielding layer 133 may be located between part of the light-transmitting adhesive layer 151 and the fourth light-transmitting protective layer 124.

In this embodiment, two opposite sides of the light-transmitting adhesive layer 151 physically contact the fourth light-transmitting protective layer 124 and the light guide device 160, respectively. In an embodiment, the light-transmitting adhesive layer 151 may further physically contact the third light-shielding layer 133. For example, the light-transmitting adhesive layer 151 may further physically contact the sidewall of the third pinhole 133*p* of the third light-shielding layer 133. In another example, the light-transmitting adhesive layer 151 may further physically contact the third light-shielding surface 133*a* of the third light-shielding layer 133 away from the sensing device 110.

In this embodiment, the light-transmitting adhesive layer 151 physically contacts the fourth light-transmitting protective layer 124, and the refractive index of the light-transmitting adhesive layer 151 is greater than the refractive index of the fourth light-transmitting protective layer 124. Therefore, in terms of part of the light emitted from the light-transmitting adhesive layer 151 to the fourth light-transmitting protective layer 124, the surface Si where the light-transmitting adhesive layer 151 is in contact with the fourth light-transmitting protective layer 124 may be a total reflection surface. In this way, through the surface Si where the light-transmitting adhesive layer 151 is in contact with the fourth light-transmitting protective layer 124, the light with the incident angle greater than the critical angle can be reflected, and collimation of the light emitted into the fourth light-transmitting protective layer 124 can be improved. Therefore, at least by adopting the above method, the thickness of at least one of the layers between the light-transmitting adhesive layer 151 and the sensing device 110 (such as the first light-transmitting protective layer 121, the second light-transmitting protective layer 122, the third light-transmitting protective layer 123, the fourth light-transmitting protective layer 124, the first flat layer 141, the second flat layer 142 and/or the third flat layer 143) can be reduced; and/or, the number of layers between the light-transmitting adhesive layer 151 and the sensing device 110 can be reduced. The reduction in the number of layers or the thickness of the layers can improve the yield rate or quality of the manufacturing process. In this way, the thickness of the sensing apparatus 100 can be reduced or the yield rate of the sensing apparatus 100 can be enhanced; and/or the quality of the optical signal (e.g., the signal-to-noise ratio (SNR) can be improved).

For example, the incident angle of the light L1 emitted from the light-transmitting adhesive layer 151 to the fourth light-transmitting protective layer 124 on the surface Si is smaller than the critical angle. Therefore, most of the light L1 can enter the fourth light-transmitting protective layer 124.

For example, the incident angle of the light L2 emitted from the light-transmitting adhesive layer 151 to the fourth light-transmitting protective layer 124 on the surface Si is greater than the critical angle. Therefore, all the light L2 can be reflected back to the light-transmitting adhesive layer 151.

It should be noted that, in FIG. 1D, FIG. 1E or other similar figures, the optical path of light (such as light L1, light L2 or other similar light) is only partially and/or exemplarily illustrated.

In this embodiment, the projection area of the light guide device 160 on a projection surface (such as: the first surface 141*a*, the second surface 142*a*, and/or the third surface 143a; or, the surface in contact with the above surface) can be set to be larger than the projection area of the corresponding third pinhole 133p on the aforementioned projection surface. In this way, the luminous flux that can be guided by the light guide device 160 can be increased.

Figure 2:
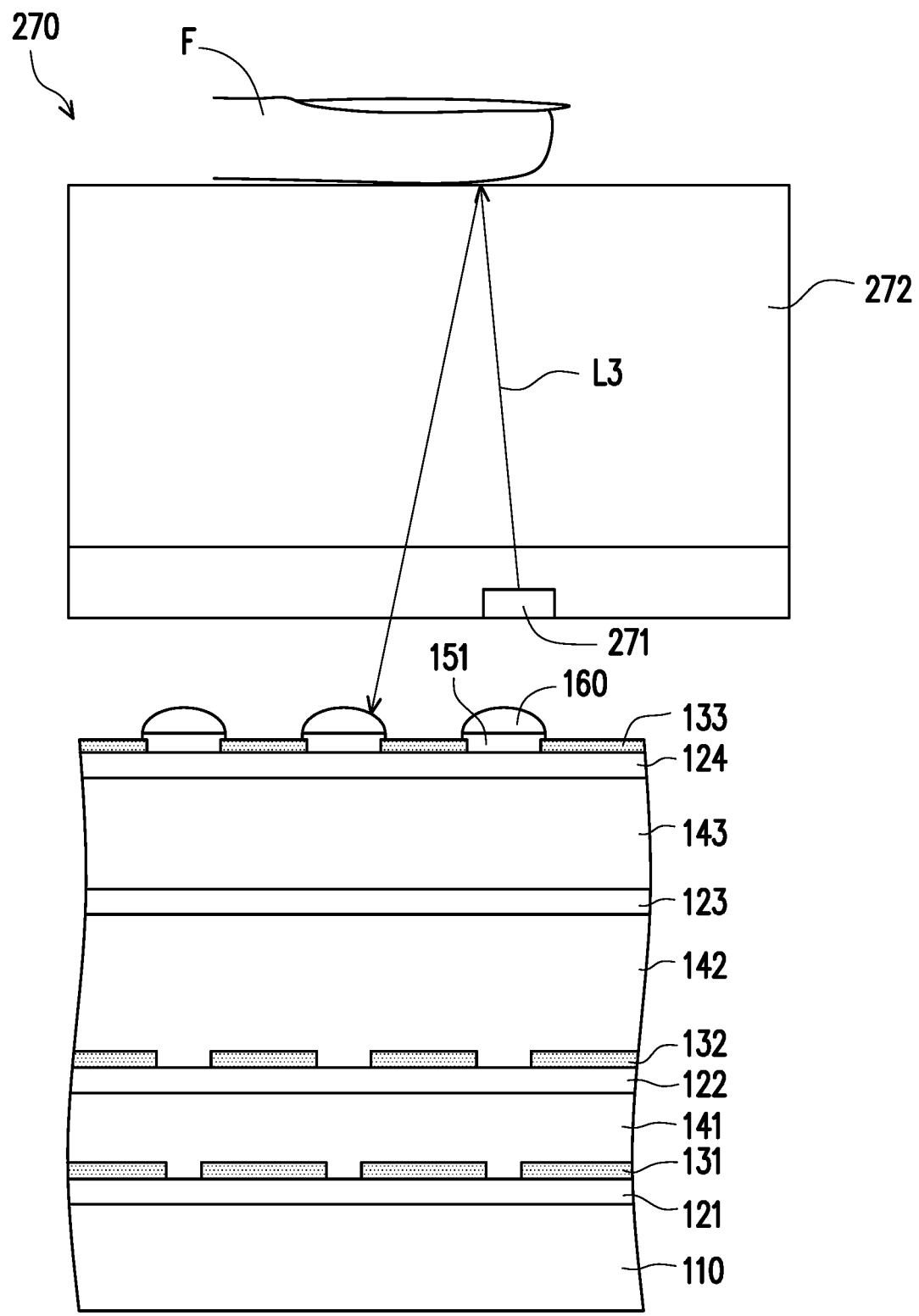
FIG. 2 is a schematic partial cross-sectional view of a sensing apparatus according to a second embodiment of the disclosure.

FIG. 2 is a schematic partial cross-sectional view of a sensing apparatus according to a second embodiment of the disclosure. The manufacturing method of the sensing apparatus 200 in this embodiment is similar to the manufacturing method of the sensing apparatus 100 in the first embodiment, and similar components are denoted by the same reference numerals, and have similar functions, materials, or forming methods, so related descriptions are omitted.

Referring to FIG. 2, the sensing apparatus 200 in this embodiment may further include a display device 270 integrated therein. The display device 270 can be configured on the sensing device 110 and/or the light guide device 160. In an embodiment, the sensing apparatus 200 may be referred to as an under display fingerprint sensor, but the disclosure is not limited thereto.

The display device 270 may include a liquid crystal display device, an organic light-emitting diode display device, a light-emitting diode display device, or other suitable display devices, the disclosure is not limited thereto. In addition, in FIG. 2, the arrangement and size of the display device 270 are only schematically illustrated, and the disclosure provides no limitation thereto.

For example, the light-emitting unit 271 in the display device 270 can emit corresponding light. Part of the light L3 can be reflected by the finger F on the protective layer 272 (such as a coverlay, but not limited thereto), and then can be emitted to the light guide device 160. In addition, light with a proper angle can be emitted to the sensing device 110 through the light guide device 160, the light-transmitting adhesive layer 151, and the fourth light-transmitting protective layer 124.

The light-emitting unit 271 is, for example, a light-emitting diode or a corresponding pixel unit, the disclosure provides no limitation thereto.

Figure 3:
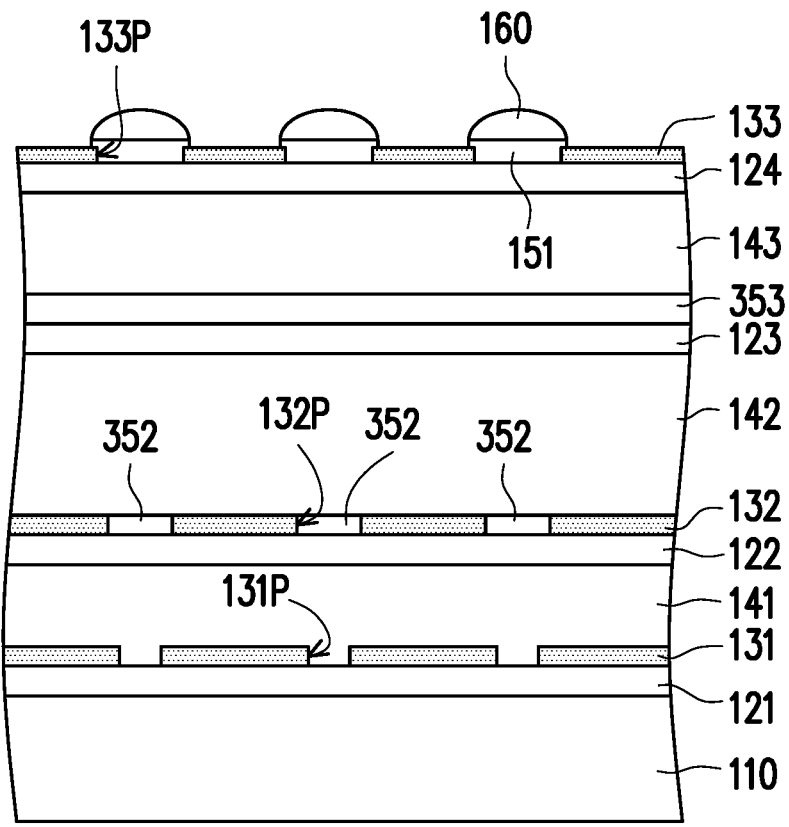
FIG. 3 is a schematic partial cross-sectional view of a sensing apparatus according to a third embodiment of the disclosure.

FIG. 3 is a schematic partial cross-sectional view of a sensing apparatus according to a third embodiment of the disclosure. The manufacturing method of the sensing apparatus 300 in this embodiment is similar to the manufacturing method of the sensing apparatus 100 in the first embodiment, and similar components are denoted by the same reference numerals, and have similar functions, materials, or forming methods, so related descriptions are omitted.

Please refer to FIG. 3, the sensing apparatus 300 may further include at least one high-refractive light-transmitting layer (for example, at least one of the high-refractive light-transmitting layer 352 or the high-refractive light-transmitting layer 353) between the fourth light-transmitting protective layer 124 and the sensing device 110. The material or forming method of the high-refractive light-transmitting layer may be the same or similar to that of the light-transmitting adhesive material layer 159. In other words, the refractive index of the high-refractive light-transmitting layer may be about 1.85 to 2.05.

It is worth noting that, in FIG. 3, the high-refractive light-transmitting layer 352 and the high-refractive light-transmitting layer 353 are exemplarily illustrated. In an embodiment that is not shown, the sensing apparatus similar to the sensing apparatus 300 may include one of the high-refractive light-transmitting layer 352 or the high-refractive light-transmitting layer 353; or, may include a high-refractive light-transmitting layer that is similar to the high-refractive light-transmitting layer 352 or the high-refractive light-transmitting layer 353.

In this embodiment, the high-refractive light-transmitting layer may be located on the corresponding light-transmitting protective layer and physically contact the light-transmitting protective layer. In this way, the collimation of the light entering the light-transmitting protective layer can be improved.

In this embodiment, the sensing apparatus 300 may further include a high-refractive light-transmitting layer 352. The high-refractive light-transmitting layer 352 is patterned according to design requirements. The high-refractive light-transmitting layer 352 may be embedded in the second pinhole 132p of the second light-shielding layer 132. The high-refractive light-transmitting layer 352 may be located on the second light-transmitting protective layer 122 and physically contact the second light-transmitting protective layer 122. Furthermore, the refractive index of the high-refractive light-transmitting layer 352 may be greater than the refractive index of the second light-transmitting protective layer 122. In this way, the collimation of the light entering the second light-transmitting protective layer 122 can be enhanced.

In this embodiment, the sensing apparatus 300 may further include a high-refractive light-transmitting layer 353. The high-refractive light-transmitting layer 353 may be located on the third light-transmitting protective layer 123 and physically contact the third light-transmitting protective layer 123. Furthermore, the refractive index of the high-refractive light-transmitting layer 353 may be greater than the refractive index of the third light-transmitting protective layer 123. In this way, the collimation of the light entering the third light-transmitting protective layer 123 can be improved.

In summary, the sensing apparatus of the disclosure can have a smaller thickness, an improved yield rate, and/or an improved optical signal quality.

What is claimed is:

1. A sensing apparatus, comprising:
a sensing device;
a first light-transmitting protective layer, located on the sensing device;
a light-shielding layer, located on the first light-transmitting protective layer, and the light-shielding layer having a pinhole corresponding to the sensing device;
a patterned light-transmitting adhesive layer, located on the first light-transmitting protective layer and at least located in the pinhole; and
a light guide device, disposed on the patterned light-transmitting adhesive layer and corresponding to the pinhole, wherein there is a gap between the light guide device and the light-shielding layer, wherein a portion of the light-shielding layer does not overlap with any one of the patterned light-transmitting adhesive layer and the light guide device,
wherein two opposite sides of the patterned light-transmitting adhesive layer physically contact the first light-transmitting protective layer and the light guide device, respectively,
wherein the patterned light-transmitting adhesive layer further physically contacts the light-shielding layer.

2. The sensing apparatus according to claim 1, wherein the patterned light-transmitting adhesive layer is further located on the light-shielding layer.

3. The sensing apparatus according to claim 1, wherein a projection area of the light guide device on the first light-transmitting protective layer is substantially the same as a projection area of the patterned light-transmitting adhesive layer on the first light-transmitting protective layer.

4. The sensing apparatus according to claim 1, wherein a material of the light-shielding layer comprises metal, and a material of the patterned light-transmitting adhesive layer comprises metal oxide.

5. A sensing apparatus, comprising:
a sensing device;
a first light-transmitting protective layer, located on the sensing device;
a light-shielding layer, located on the first light-transmitting protective layer, and the light-shielding layer having a pinhole corresponding to the sensing device;
a patterned light-transmitting adhesive layer, located on the first light-transmitting protective layer and at least located in the pinhole; and
a light guide device, disposed on the patterned light-transmitting adhesive layer and corresponding to the pinhole, wherein there is a gap between the light guide device and the light-shielding layer, wherein a portion of the light-shielding layer does not overlap with any one of the patterned light-transmitting adhesive layer and the light guide device,
wherein the patterned light-transmitting adhesive layer physically contacts the first light-transmitting protective layer, and a refractive index of the patterned light-transmitting adhesive layer is greater than a refractive index of the first light-transmitting protective layer.

6. The sensing apparatus according to claim 1, further comprising:
a second light-transmitting protective layer, located between the first light-transmitting protective layer and the sensing device; and
a high-refractive light-transmitting layer, located on the second light-transmitting protective layer and physically contacting the second light-transmitting protective layer, and a refractive index of the high-refractive light-transmitting layer being greater than a refractive index of the second light-transmitting protective layer.

7. The sensing apparatus according to claim 1, wherein a refractive index of the patterned light-transmitting adhesive layer is greater than a refractive index of the light guide device.

8. A sensing apparatus, comprising:
a sensing device;
a first light-transmitting protective layer, located on the sensing device;
a light-shielding layer, located on the first light-transmitting protective layer, and the light-shielding layer having a pinhole corresponding to the sensing device;
a patterned light-transmitting adhesive layer, located on the first light-transmitting protective layer and at least located in the pinhole; and
a light guide device, disposed on the patterned light-transmitting adhesive layer and corresponding to the pinhole, wherein a refractive index of the patterned light-transmitting adhesive layer is greater than a refractive index of the light guide device, wherein a portion of the light-shielding layer does not overlap with any one of the patterned light-transmitting adhesive layer and the light guide device,
wherein the patterned light-transmitting adhesive layer physically contacts the first light-transmitting protective layer, and the refractive index of the patterned light-transmitting adhesive layer is greater than a refractive index of the first light-transmitting protective layer.

9. The sensing apparatus according to claim 8, wherein the patterned light-transmitting adhesive layer is further located on the light-shielding layer.

10. The sensing apparatus according to claim 8, wherein two opposite sides of the patterned light-transmitting adhesive layer physically contact the first light-transmitting protective layer and the light guide device, respectively.

11. The sensing apparatus according to claim 10, wherein the patterned light-transmitting adhesive layer further physically contacts the light-shielding layer.

12. The sensing apparatus according to claim 8, wherein a projection area of the light guide device on the first light-transmitting protective layer is substantially the same as a projection area of the patterned light-transmitting adhesive layer on the first light-transmitting protective layer.

13. The sensing apparatus according to claim 8, wherein a material of the light-shielding layer comprises metal, and a material of the patterned light-transmitting adhesive layer comprises metal oxide.

14. The sensing apparatus according to claim 8, further comprising:
a second light-transmitting protective layer, located between the first light-transmitting protective layer and the sensing device; and
a high-refractive light-transmitting layer, located on the second light-transmitting protective layer and physically contacting the second light-transmitting protective layer, and a refractive index of the high-refractive light-transmitting layer is greater than a refractive index of the second light-transmitting protective layer.

15. The sensing apparatus according to claim 5, wherein the patterned light-transmitting adhesive layer is further located on the light-shielding layer.

16. The sensing apparatus according to claim 5, wherein a projection area of the light guide device on the first light-transmitting protective layer is substantially the same as a projection area of the patterned light-transmitting adhesive layer on the first light-transmitting protective layer.

17. The sensing apparatus according to claim 5, wherein a material of the light-shielding layer comprises metal, and a material of the patterned light-transmitting adhesive layer comprises metal oxide.

* * * * *